United States Patent [19]
Aoki et al.

[11] Patent Number: 5,184,201
[45] Date of Patent: Feb. 2, 1993

[54] STATIC INDUCTION TRANSISTOR

[75] Inventors: Shinobu Aoki; Haruo Takagi; Takanori Okabe, all of Kariya, Japan

[73] Assignee: Kabushiki Kaisha Toyoda Jidoshokki Seisakusho, Kariya, Japan

[21] Appl. No.: 793,235

[22] Filed: Nov. 8, 1991

Related U.S. Application Data

[63] Continuation-in-part of Ser. No. 533,578, Jun. 5, 1990, abandoned.

[30] Foreign Application Priority Data

Jun. 7, 1989 [JP] Japan ................................. 1-144571
Jun. 13, 1989 [JP] Japan ................................. 1-150268

[51] Int. Cl.$^5$ ......................................... H01L 29/747
[52] U.S. Cl. .................................. 257/266; 257/264
[58] Field of Search .............. 357/39 T, 39 S, 39 LA, 357/39 P, 39 E, 39 C, 39 A, 20, 22, 22 B, 22 D, 22 C, 22 F, 34, 36

[56] References Cited

U.S. PATENT DOCUMENTS

| | | | |
|---|---|---|---|
| 4,529,995 | 7/1985 | Sakai et al. | 357/20 |
| 4,605,948 | 8/1986 | Martinelli | 357/20 |
| 4,651,015 | 3/1987 | Nishizawa et al. | 357/22 B |
| 4,684,968 | 8/1987 | Ohta et al. | 357/22 B |
| 4,742,380 | 5/1988 | Chang et al. | 357/39 |
| 4,774,560 | 9/1988 | Coe | 357/20 |
| 4,857,983 | 8/1989 | Baliga et al. | 357/39 |
| 4,901,130 | 2/1990 | Jeudi et al. | 357/39 |

FOREIGN PATENT DOCUMENTS

| | | | |
|---|---|---|---|
| 53-126870 | 11/1978 | Japan | 357/20 |
| 60-154669 | 8/1985 | Japan | 357/20 |
| 61-85854 | 5/1986 | Japan | 357/20 |
| 1145859 | 6/1989 | Japan | 357/39 |
| 2134705 | 8/1984 | United Kingdom | 357/20 |
| 8202981 | 9/1982 | World Int. Prop. O. | 357/20 |

Primary Examiner—Andrew J. James
Assistant Examiner—Hung Xoan Dang
Attorney, Agent, or Firm—Brooks, Haidt Haffner & Delahunty

[57] ABSTRACT

A static induction transistor has a gate region formed with a protrusion extending toward a drain region. The protrusion is located toward one side of the gate region such that a shallower gate region lies between the protrusion and the nearest source region. When a reverse voltage higher than the withstand voltage is applied between the gate and drain, avalanche breakdown occurs only in a region immediately below the protrusion, and no hot carriers are allowed to flow into a source region. Deterioration of the voltage-withstanding property and destruction of the device is thereby prevented. Another embodiment has a semiconductor region of a first conductivity type formed in a peripheral portion of a semiconductor layer of the first conductivity type in which a plurality of gate regions are disposed and adjacent a first major surface thereof. The distance between the semiconductor region and the nearest gate region is less than the distance between gate and drain regions such that the withstand voltage between the semiconductor region and the nearest gate region is less than that between the gate region and drain region. When a reverse bias voltage higher than a withstand voltage is applied between the gate and drain, the avalanche breakdown occurs only between the semiconductor region and the gate region nearest thereto.

7 Claims, 12 Drawing Sheets

STATIC INDUCTION TRANSISTOR

This application is a continuation-in-part of application Ser. No. 07/533,578, filed Jun. 5, 1990, now abandoned.

BACKGROUND OF THE INVENTION

1. Field of the Invention

The present invention relates to a static induction transistor and, more particularly, to a static induction transistor which permits prevention of the deterioration of its voltage-withstanding property and its destruction even when a reverse bias voltage higher than its withstand voltage is applied between its gate and drain.

2. Description of the Related Art

A static induction transistor (hereinafter abbreviated to SIT) is easy in its multi-channel version by the use of a vertical structure, thus permitting its operating current to be increased. In addition, the SIT is suited for applications at high power because a withstand voltage between its gate and drain can be increased by insertion of a high-resistivity layer between the gate and drain.

FIG. 1 is a sectional view of a conventional SIT 10. As shown, an n$^-$ type epitaxial layer 12 is formed on a major surface of an n$^+$ type silicon substrate 11. On the side of the major surface of n$^-$ epitaxial layer 12 are formed p$^+$ type gate regions 13 and n$^+$ type source regions 14. p$^+$ type gate regions 13 and n$^+$ type source regions 14 are respectively connected to gate electrodes 16 and source electrodes 17 via contact holes formed by etching an oxide layer 15 formed on n$^-$ type epitaxial layer 12. On the other major surface of n$^+$ type substrate 11 is formed a drain electrode 18. Gate electrodes 16, source electrodes 17 and drain electrode 18 are made of metal such as aluminum. The n$^+$ type source region 14 is electrically connected to source electrode 17 by polysilicon 21. In the above structure, a substrate region that is located below n$^+$ type source region 14 and between p$^+$ type gate regions 13 forms a channel region 19. The n$^-$ type epitaxial layer 12 and n$^+$ type substrate 11 form the drain region.

SIT 10 structured as above is a normally-off type of SIT in which channel regions 19 are all depleted of carriers when a forward bias voltage higher than a predetermined voltage is not applied between gate electrode 16 and source electrode 17 and no current flow is produced between the source and drain.

FIGS. 2A and 2B illustrate methods of applying voltages to gate electrode (G) 16, source electrode (S) 17 and drain electrode (D) 18 in measuring the drain-source breakdown voltage (BV$_{DSS}$) and the drain-gate breakdown voltage (BV$_{DGO}$).

In measuring the drain-source breakdown voltage (BV$_{DSS}$), as illustrated in FIG. 2A, an equal voltage is applied to gate electrode 16 and source electrode 17 and a reverse bias voltage Va is applied to gate electrode 16 and drain electrode 18.

In measuring the drain-gate breakdown voltage (BV$_{DGO}$), as illustrated in FIG. 2B, a reverse bias voltage Va is applied between gate electrode 16 and drain electrode 18.

As stated above, a reverse voltage is applied between the gate and drain in measuring either of the drain-source breakdown voltage (BV$_{DSS}$) and the drain-gate breakdown voltage (BV$_{DGO}$). Thus, since the pn junction formed of p$^+$ type gate region 13 and n$^-$ type epitaxial layer (drain layer) 12 is reverse-biased in measuring either of the drain-source breakdown voltage (BV$_{DSS}$) and the drain-gate breakdown voltage (BV$_{DGO}$), a depletion layer 20 is widely formed around the pn junction, particularly in n$^-$ type epitaxial layer 12 which has a low impurity concentration. When the reverse bias voltage Va is further increased, depletion layer 20 will reach to the interface between n$^-$ type epitaxial layer 12 and n$^+$ type substrate 11 as depicted in FIG. 3. When an electric field E at the junction between p$^+$ type gate region 13 and n$^-$ type epitaxial layer 12, across which the maximum electric field Emax is applied, reaches the critical electric field Ecrit at which avalanche breakdown begins, the avalanche breakdown will occur at the junction between p$^+$ type gate region 13 and n$^-$ type epitaxial layer 12. As a result, electron-hole pairs are generated suddenly and markedly within depletion layer 20 (the electrons are indicated by black dots, while the holes are indicated by white dots in FIG. 3). Of the generated electron-hole pairs, the electrons are accelerated by the electric field E within depletion layer 20 so that their energy increase (they become hot electrons), thus causing secondary avalanche breakdown at the interface between n$^-$ type epitaxial layer 12 and n$^+$ type substrate 11 where there are many crystal defects. Of electron-hole pairs generated at the interface between n$^-$ type epitaxial layer 12 and n$^+$ type substrate 11, the electrons are accelerated by the electric field E within depletion layer 20 so that they flow toward n$^+$ type substrate 11 in the form of hot electrons. On the other hand, the holes are likewise accelerated by the electric field E within depletion layer 20 so that they flow toward p$^+$ type gate region 13 in the form of hot holes. Part of the holes (hot holes) will flow into channel region 19 and n$^+$ type source region 14.

The flow of holes (hot holes) resulting from the secondary avalanche breakdown into channel region 19 and n$^+$ source region 14 in the forms of hot holes may cause the deterioration of voltage-withstanding property and destruction of the device. At the time of measurement of the drain-source breakdown voltage BV$_{DSS}$ in the way as illustrated in FIG. 2A, the presence of holes which flow into n$^+$ type source region 14 can be observed as a source current Is.

It is predicted that the device destruction described above results from the discharge of energy, which holes (hot holes) generated by the secondary avalanche breakdown acquire from electric field E within depletion layer 20 when they flow into n$^+$ type source region 14, as heat at the interface between n$^+$ source region 14 and n$^-$ type epitaxial layer 12.

SUMMARY OF THE INVENTION

It is therefore an object of the present invention to provide a static induction transistor which is capable of avoidance of the flow of carriers resulting from avalanche breakdown of a drain layer into a channel region and a source region even when a reverse voltage higher than the withstand voltage is applied to its gate and drain and thus permits prevention of the deterioration of its voltage-withstanding property and its destruction.

According to a first aspect of the present invention there is provided a static induction transistor comprising a semiconductor layer of a first conductivity type, spaced apart gate regions of a second conductivity type disposed adjacent a first major surface of said semiconductor layer, a source region of said first conductivity type formed adjacent said first major surface of said semiconductor layer in between each of said gate regions, said source regions being shallower than said gate regions, and a drain region of said first conductivity type formed on a second major surface of said semiconductor layer generally opposite said first major surface, characterized in that one of said gate regions is located nearer to the periphery of said semiconductor layer than the other of said gate regions and has a portion formed deeper than the remainder of said one gate region so as to protrude toward said drain region, said deeper portion of said one gate region being located adjacent that boundary of said one gate region that is closest to said periphery of said semiconductor layer and spaced sufficiently close to said drain region to restrict avalanche breakdown to the area immediately below said deeper portion and prevent holes from flowing into the channel regions below said source regions.

According to a second aspect of the present invention there is provided a static induction transistor comprising a semiconductor layer of a first conductivity type, spaced apart buried gate regions of a second conductivity type formed within said semiconductor layer, a source region of said first conductivity type formed adjacent a first major surface of said semiconductor layer, said source region having a higher impurity concentration than said semiconductor layer, and a drain region of said first conductivity type formed on a second major surface of said semiconductor layer generally opposite said first major surface, characterized in that one of said buried gate regions is located nearer to the periphery of said semiconductor layer than the other of said gate regions and has a portion formed deeper than the remainder of said one gate region so as to protrude toward said drain region, said deeper portion of said one gate region being located adjacent that boundary of said one gate region that is closest to said preiphery of said semiconductor layer and spaced sufficiently close to said drain region to restrict avalanche breakdown to the area immediately below said deeper portion and prevent holes from flowing into the channel regions below said source regions.

According to a third aspect of the present invention there is provided a static induction transistor comprising a semiconductor layer of a first conductivity type, spaced apart gate regions of a second conductivity type disposed adjacent a first major surface of said semiconductor layer, a source region of said first conductivity type formed adjacent said first major surface of said semiconductor layer in between each of said gate regions, said source regions being shallower than said gate regions, and a drain region of said first conductivity type formed on a second major surface of said semiconductor layer generally opposite said first major surface, characterized in that a semiconductor region of said first conductivity type is formed in a peripheral portion of said semiconductor layer adjacent said first major surface at a distance from the nearest gate region that is less than the distance between said gate region and said drain region, whereby the withstand voltage between said semiconductor region and said nearest gate region is less than the withstand voltage between said gate regions and said drain region.

In the transistor structure according to the first aspect of the present invention, of the gate regions of the second conductivity type formed in the vicinity of the major surface of the semiconductor layer of the first conductivity type, a gate region which is formed in the peripheral portion (referred to as a peripheral gate region for convenience) has a protrusion which is formed deeper toward the drain region. Thus, the distance from the protrusion of the peripheral gate region to the interface between the semiconductor layer and the drain region is made shorter than the distance from other gate regions to the interface between the semiconductor layer and the drain region. Thus, avalanche breakdown at the interface between the semiconductor layer and the drain region is allowed to occur only in an interface region immediately below the protrusion of the peripheral gate region. The electric field in a depletion layer formed between the peripheral gate region and the interface is vertical with respect to the surface of the device. Thus, the hot carriers resulting from the avalanche breakdown will be allowed to flow not into the source region but into the gate region only.

Therefore, the avalanche breakdown will not occur at a portion of the interface between the semiconductor layer and the drain region immediately below the source region and, even if a reverse bias voltage higher than the withstand voltage is applied between the gate and drain, the hot carriers resulting from the avalanche breakdown at the interface are prevented from flowing into the source region, as opposed to the conventional static induction transistor. This will prevent the deterioration of the voltage-withstanding property and the destruction of the device when a reverse voltage higher than the withstand voltage is applied between the gate and drain.

In the transistor structure according to the second aspect of the present invention, of the buried gate regions of the second conductivity type formed in the vicinity of the major surface of the semiconductor layer of the first conductivity type, a buried gate region which is formed in the peripheral portion (referred to as a peripheral buried gate region for convenience) has, at its part, a protrusion which is formed deeper toward the drain region. Because of the same action as in the first aspect, therefore, avalanche breakdown at the interface between the semiconductor layer and the drain region is allowed to occur only in an interface region immediately below the protrusion of the peripheral buried gate region when a reverse bias voltage more than the withstanding voltage is applied between the gate and drain regions. For this reason, like the transistor according to the first aspect of the present invention, the avalanche breakdown will not occur at a portion of the interface between the semiconductor layer and the drain region immediately below the source region and, even if a reverse bias voltage higher than the withstand voltage is applied between the gate and drain, the hot carriers resulting from the avalanche breakdown at the interface are prevented from flowing into the source region, as opposed to the conventional static induction transistor. This will prevent the deterioration of the voltage-withstanding property and the destruction of the device when a reverse voltage higher than the withstand voltage is applied between the gate and drain.

In the transistor structure according to the third aspect of the present invention, the withstand voltage between the semiconductor region of the first conductivity type formed in the peripheral portion of the semiconductor layer of the first conductivity type and the gate region nearest thereto is made lower than withstand voltage between the gate region and drain region when a reverse bias voltage higher than the withstand voltage is applied between the gate and drain. Thus, the avalanche breakdown will occur in a depletion region between the semiconductor region and the gate region nearest thereto. The hot carriers resulting from the avalanche breakdown are allowed to flow into the gate region nearest to the semiconductor region, not into the source region, by the electric field in the depletion region.

Therefore, the avalanche breakdown will not occur at a portion of the interface between the semiconductor layer and the drain region immediately below the source region even if a reverse bias voltage higher than the withstand voltage is applied between the gate and drain, and hence the hot carriers resulting from the avalanche breakdown at the interface are prevented from flowing into the source region, as opposed to the conventional static induction transistor. This will prevent the deterioration of the voltage-withstanding property and the destruction of the device even when a reverse voltage higher than the withstand voltage is applied between the gate and drain.

BRIEF DESCRIPTION OF THE DRAWINGS

FIG. 1 is a sectional view of a conventional static induction transistor;

DETAILED DESCRIPTION OF THE PREFERRED EMBODIMENTS

Hereinafter, the preferred embodiments will be described in accordance with the attached drawings.

Figure 4:
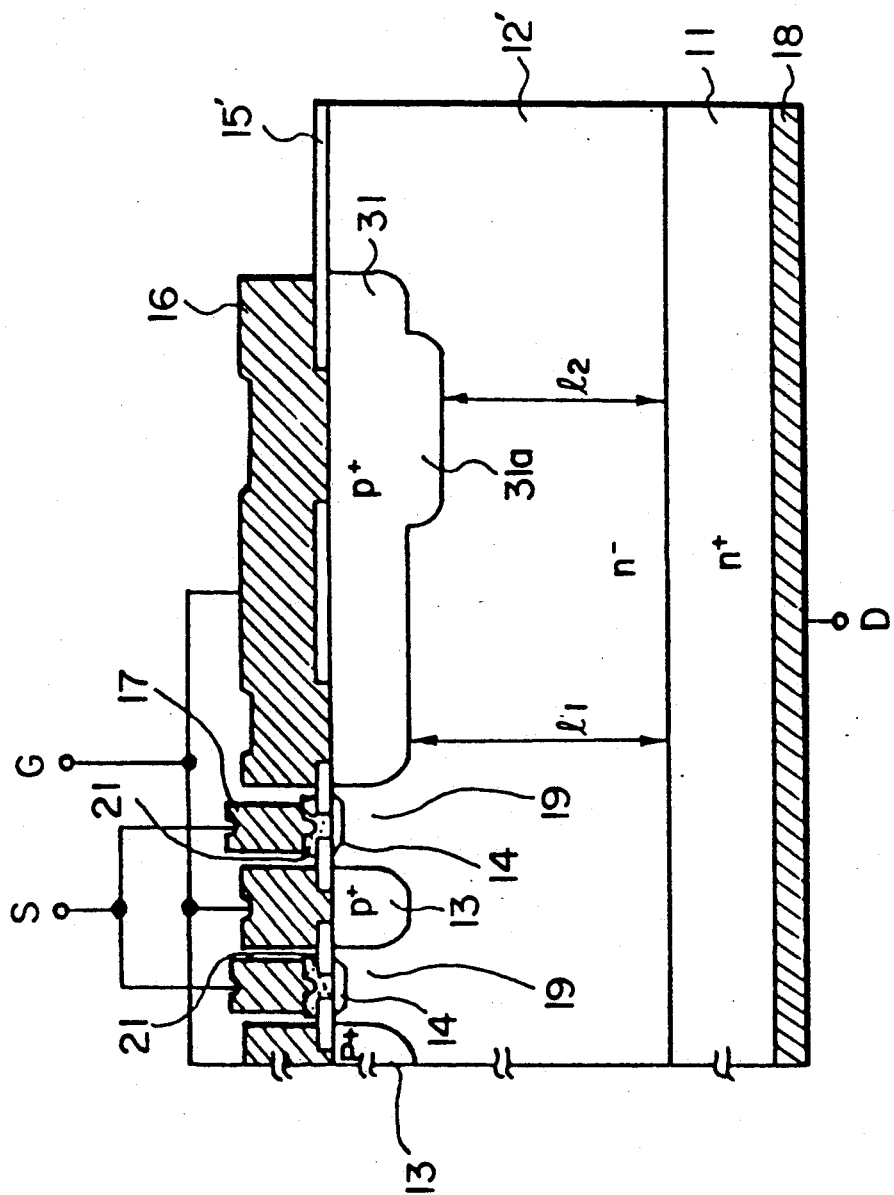
FIG. 4 is a sectional view of a static induction transistor according to a first embodiment of the present invention.
Figure 5:
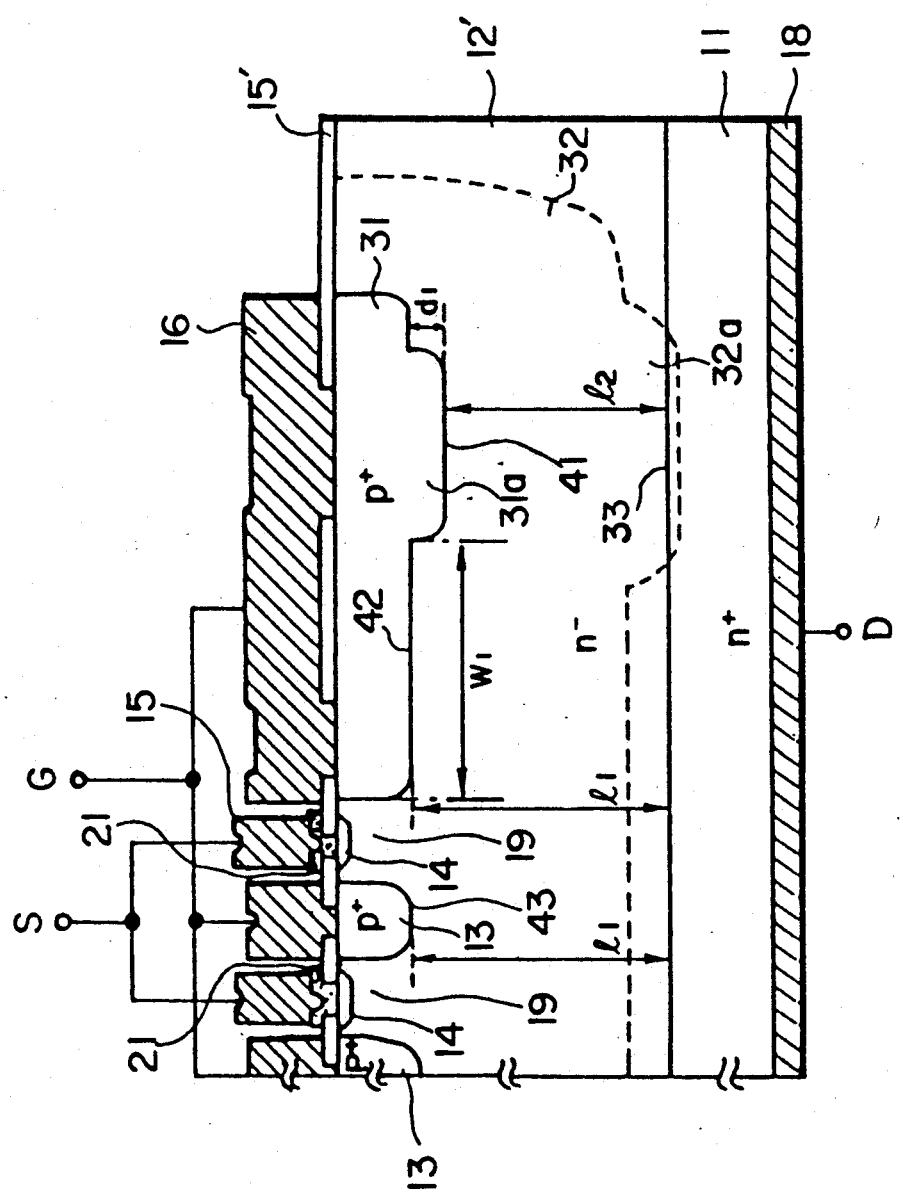

FIG. 4 is a sectional view of a static induction transistor (SIT) according to a first embodiment of the present invention. In this figure, the same regions as those of the SIT of FIG. 1 are designated by like reference numerals. However, the n⁻ type epitaxial layer and the insulating layer slightly differ from those of FIG. 1 in profile and they are thus designated as 12' and 15'.

Figure 5:
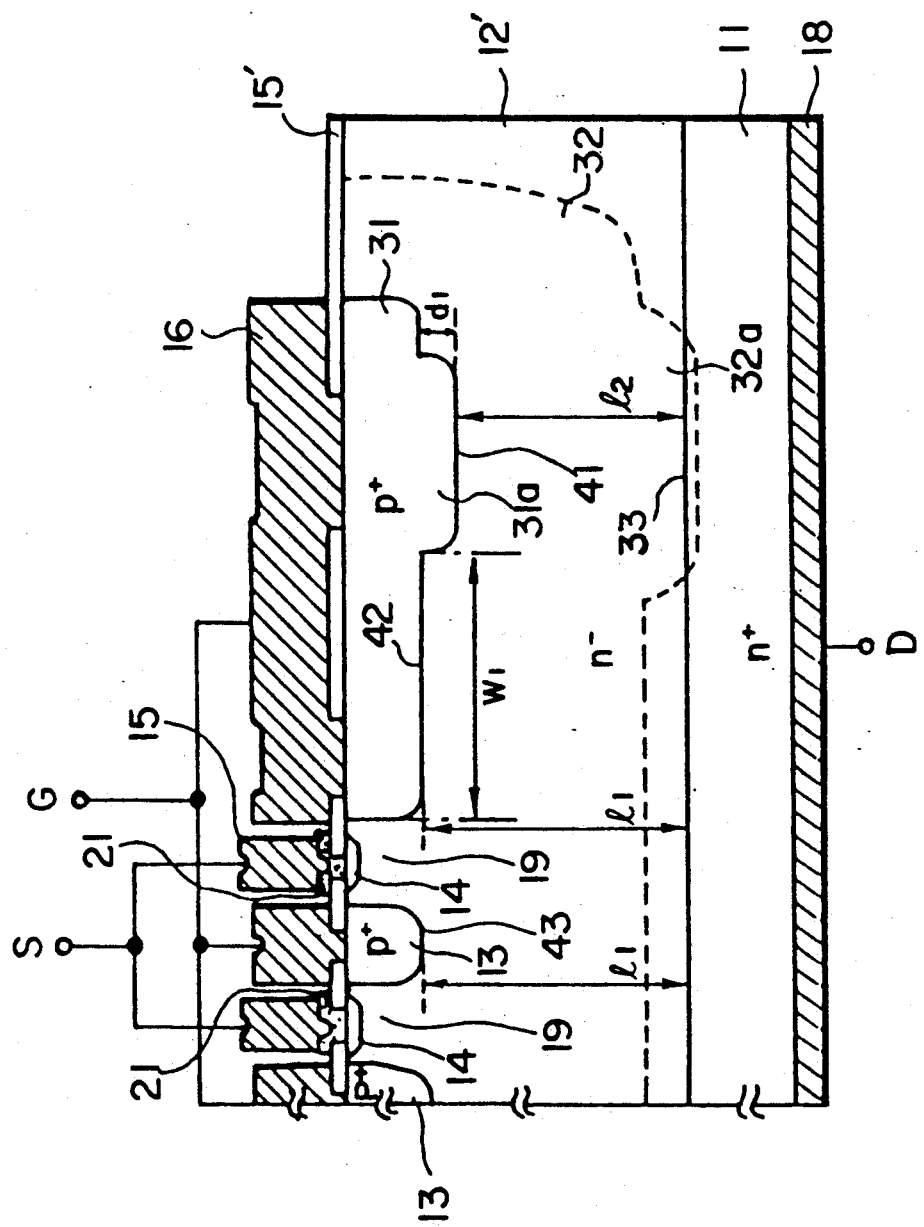
FIG. 5 is a diagram illustrating the widening of a depletion region when a reverse bias voltage is applied between the gate and drain of the static induction transistor of FIG. 4.

The SIT of the present invention is distinct from the conventional SIT 10 of FIG. 1 in that, firstly, the horizontal length of p+ type gate region 31 provided in a peripheral portion of the SIT10 of the invention is made longer than that of gate region 13 of the conventional SIT and, secondly, p+ type gate region 31 in the peripheral portion (hereinafter referred to as peripheral p+ type gate region 31) has, at its part on the side of one end of the device, a diffused region (protrusion 31a) which is about 2 μm deeper, the dimension d₁ in FIG. 5, than another p+ type gate region 13.

Because of the above structure, the distance l2 from protrusion 31a of peripheral p+ type gate region 31 to the interface between n+ type substrate 11 and n⁻ type epitaxial layer 12' is shorter than the distance l1 from p+ type gate regions 13 other than peripheral p+ type gate region 31 to the interface between n+ type substrate 11 and n⁻ type epitaxial layer 12' (l2<l1). In addition, the spacing of the protrusion 31a from the boundary of the region 31 which is closest to the nearest source region 14, the dimension W₁ in FIG. 5, is made longer than the distance l2, or is at least sufficient in relation to dimension l2, to restrict avalanche breakdown to the area immediately below the deeper portion of gate region 31 and prevent holes from flowing into the channel regions 19 below the source regions 14.

When, therefore, a voltage Va is applied between gate electrode 16 and drain electrode 18 so as to reverse bias the path between the gate (p+ type gate region 13 or peripheral p+ type gate region 31) and the drain (n⁻ type epitaxial layer 12' and n+ type substrate 11), depletion region 32 will widen within n⁻ type epitaxial layer 12' which is low in impurity concentration. When the reverse bias voltage Va is increased to a predetermined level, depletion region 32a that is below protrusion 31a of peripheral p+ type gate region 31 will first reach to interface 33 between n⁻ epitaxial layer 12' and n+ type substrate 11 as illustrated in FIG. 5. After depletion region 32a has reached to interface 33 between n⁻ epitaxial layer 12' and n+ type substrate 11, if reverse bias voltage Va is further increased, depletion region 32a will widen up to n+ type substrate 11. In this case, since n+ type substrate is much higher in impurity concentration than n⁻ type epitaxial layer 12', an increase in the size of depletion region 32a relative to an increase in reverse bias voltage Va in substrate 11 is smaller than in epitaxial layer 12'. For this reason, the electric field E1 at junction 41 between protrusion 31a of peripheral p+ type gate region 31 and n⁻ type epitaxial layer 12' becomes higher than the electric field E2 at junction 42 between other portions of peripheral p+ type gate region 31 than protrusion 31a and n⁻ type epitaxial layer 12' and the electric field E3 at junction 43 between other p+ type gate regions 13 and n⁻ type epitaxial layer 12' so that primary avalanche breakdown takes place first at junction 41 between protrusion 31a of peripheral p+ type gate region 31 and n⁻ type epitaxial layer 12'. This primary avalanche breakdown will cause secondary avalanche breakdown at that interface between n⁻ type epitaxial layer 12' and n+ type substrate 11 which contains many crystal defects in accordance with the same mechanism as described in the Description of the Related Art.

The electric field in depletion region 32a at which the secondary avalanche breakdown begins is directed from n+ type substrate 11 to protrusion 31a of peripheral p+ type gate region substantially vertically with respect to n+ type substrate 11. Of electron-hole pairs generated, therefore, most of the holes will flow into protrusion 31a of peripheral p+ type gate region 31.

For this reason, no avalanche breakdown will occur in depletion region 32 immediately below n+ type source region 14. Unlike the prior art, therefore, holes (hot holes) will not flow into channel region 19 and n+ type source region 14.

By causing the avalanche breakdown in depletion region 32a immediately below protrusion 31a of peripheral p+ type gate region 31 before the avalanche breakdown is produced in depletion region 32 immediately below n+ type source region 14 in that way, it becomes possible to prevent holes (hot holes) from flowing into channel region 19 and n+ type source region 14, thus permitting prevention of the deterioration of the voltage-withstanding property and moreover the destruction of the device.

Next, a method of manufacturing an n-channel SIT having the structure described above will be described with reference to FIGS. 6A to 6H.

These figures are cross sectional views of a unitary part of an n-channel SIT. The dimensions of its various parts are exaggerated for easier understanding of manufacturing steps and they are thus not in proportion to those in a real device.

Figure 6A:
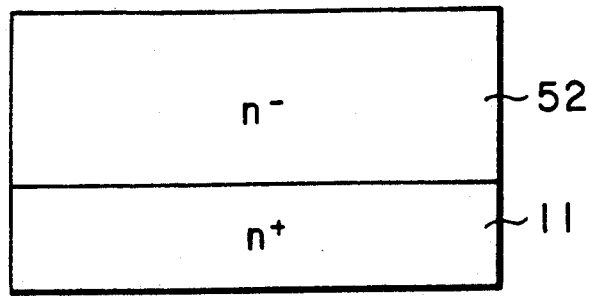
FIGS. 6A to 6H illustrate successive steps of manufacture of the static induction transistor of FIG. 4.

First, as shown in FIG. 6A, an n⁻ type layer 52 is epitaxially grown over one of major surfaces of an n+ type substrate 11, which is heavily doped with donors, for example, antimony (Sb), to a thickness of about 30 micrometers.

Figure 6B:
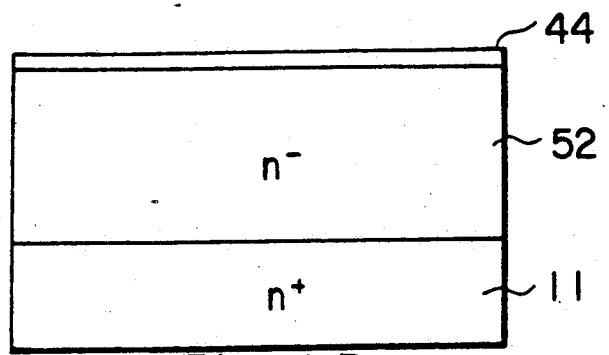
Figure 6C:
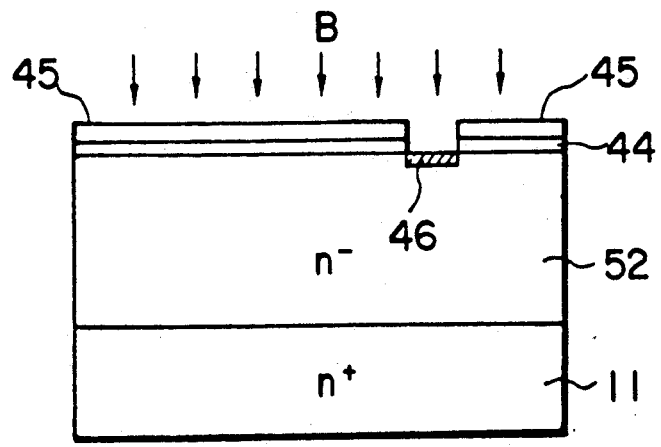

Subsequently, as shown in FIG. 6B, a first oxide layer 44 of oxide, such as silicon dioxide, is formed on the entire surface of n⁻ type epitaxial layer 52 to a thickness of about 700 Å. Then, as shown in FIG. 6C, a portion of first oxide layer 44 which is located over protrusion 31a of peripheral p+ type gate region 31 (refer to FIG. 5) is etched away by a conventional photolithographic process. Next, by using oxide layer 44 and photoresist layer 45 as a mask, acceptors, such as boron (B), are introduced into n⁻ type epitaxial layer 52 through the opening formed in layers 44 and 45 to form a p+ type region 46 in the vicinity of the major surface of epitaxial layer 52. This p+ type region 46 has an impurity concentration of about $10^{19}$ impurities per cubic centimeter.

Figure 6D:
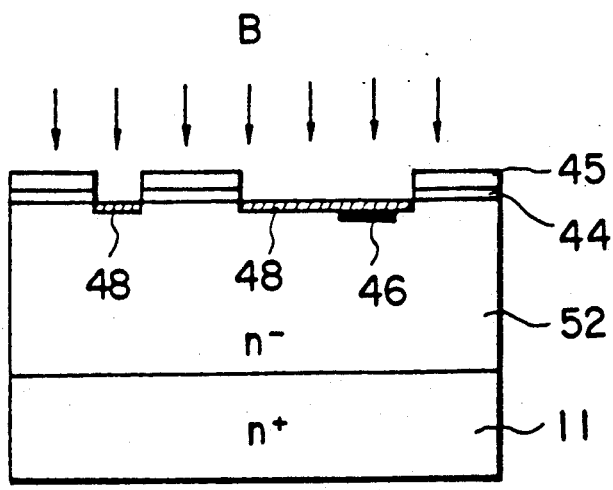

Moreover, as shown in FIG. 6D, by using first oxide layer 44 and photoresist layer 45 again as a mask, acceptors, such as boron, are introduced into upper portions of that regions of n⁻ type epitaxial layer 52 where p+ type gate region 13 and peripheral p+ type gate region 31 are to be formed, to thereby form p+ type regions 48.

Figure 6E:
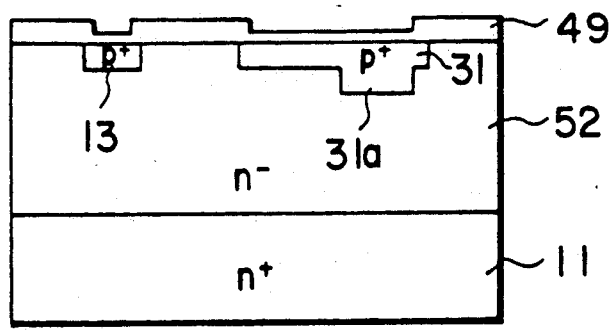

Subsequently, as shown in FIG. 6E, drive-in diffusion is performed to drive p+ type region 46 and p+ type region 48 deeper into n⁻ type epitaxial layer 52, thereby forming p+ type gate region 13 and peripheral p+ type gate region 31. Following the drive-in diffusion, a second insulating layer 49 consisting of silicon dioxide is formed on the surface of n⁻ type epitaxial layer 52 as shown.

Figure 6F:
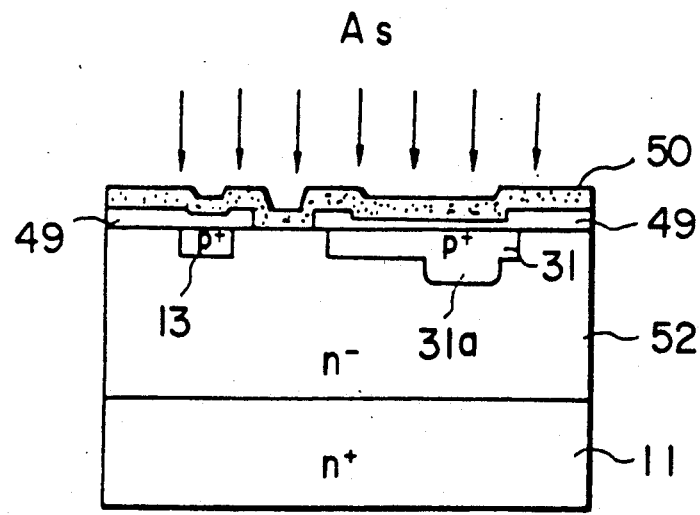
Figure 6G:
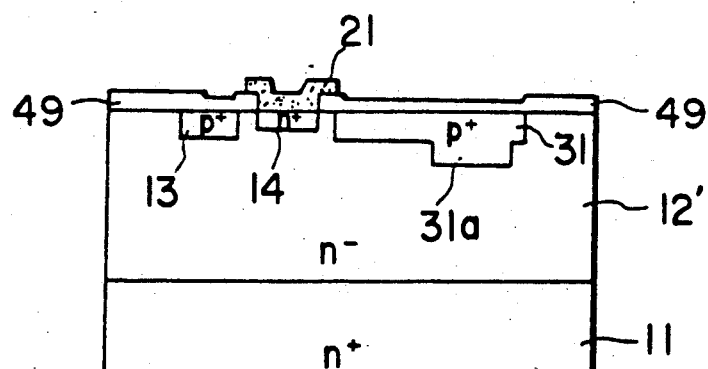

Furthermore, as shown in FIG. 6F, after that portion of second insulating layer 49 which is located over the region where n+ type source region 14 is to be formed is etched a way by means of a photolithographic process, polysilicon layer 50 is formed over the surface of n⁻ type epitaxial layer 52, on which second oxide layer 49 is formed, by means of silane thermal decomposition using regular-pressure or low-pressure CVD, for example. Subsequently, donor ions of, for example, arsenic (As) are implanted into the upper surface of n⁻ type epitaxial layer 52 on which second oxide layer 49 is formed to form n+ type source region 14 in the vicinity of the surface of n⁻ type epitaxial layer 52 by means of solid-phase diffusion. This n+ type source region 14 has a depth of about 0.4 micrometers and an impurity concentration of about $10^{20}$ impurities per cubic centimeter. Next, by using a photolithographic process, polysilicon layer 50 is selectively etched away to leave polysilicon layer 21 which is located over n+ type source region 14 and overlaps second oxide layer 49 on the both sides of source region 14.

Figure 6H:
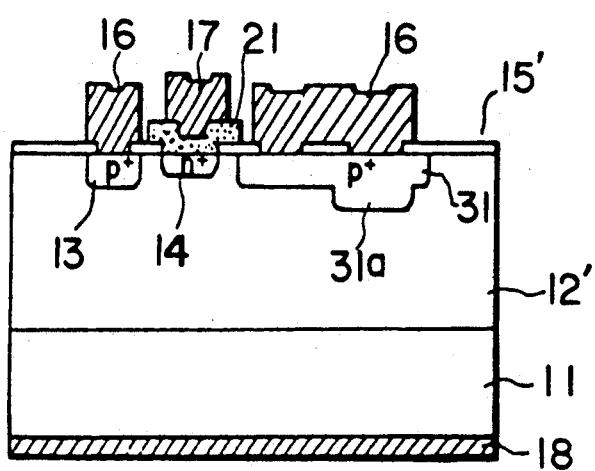

In the subsequent step, as shown in FIG. 6H, by using a photolithographic process, second oxide layer 49 is selectively etched away to form contact holes on p+ type gate region 13 and p+ type peripheral gate region 31 (at this point oxide layer 15' described above is formed). Next, by means of sputtering or vacuum evaporation, for example, an electrode material, such as aluminum or aluminum silicon, is deposited onto the entire surface of n⁻ type epitaxial layer 12' on which oxide layer 15' and polysilicon layer 21 are formed. Then, the electrode material is selectively removed by means of a photolithographic process to thereby form source electrode 17 and gate electrode 16. Furthermore, an electrode material, such as aluminum or aluminum-silicon, is deposited onto the other major surface of n+ type substrate 11 by means of sputtering or vacuum evaporation to form drain electrode 18.

Figure 7:
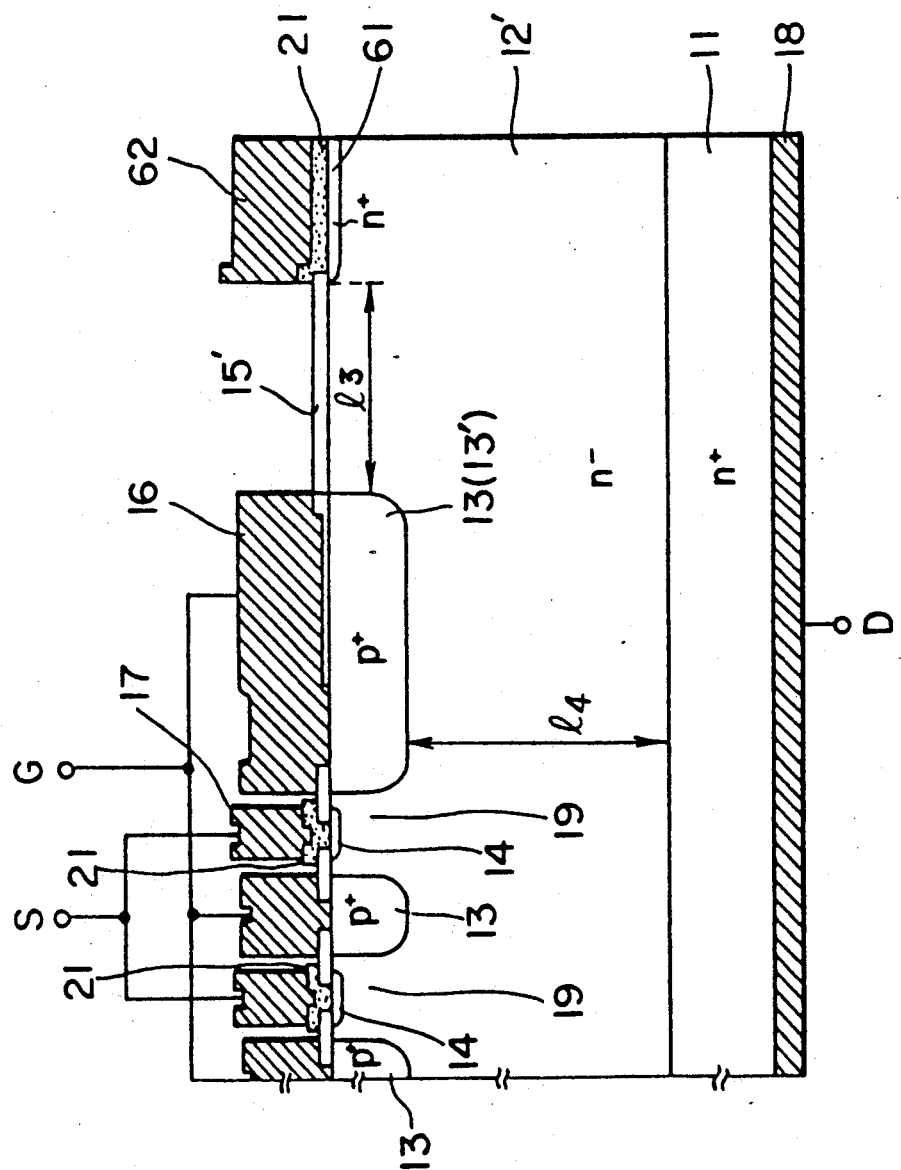
FIG. 7 is a sectional view of a static induction transistor according to a second embodiment of the present invention.

Next, FIG. 7 is a cross sectional view of a static induction transistor (SIT) according to a second embodiment of the present invention.

In FIG. 7, the same regions as those in FIG. 1 are designated by like reference numerals. However, the n⁻ type epitaxial layer and the insulating layer are designated by 12' and 15', respectively, because they are slightly different from corresponding parts in FIG. 1 in profile.

Unlike the conventional SIT shown in FIG. 1, the SIT of the second embodiment is provided with an n+ type semiconductor region 61 which formed in the vicinity of a major surface of n⁻ type epitaxial layer 12' and in a peripheral portion thereof. In the present embodiment, this n+ type region 61 is formed at the step of forming n+ type source region 14 and is the same as n+ type source region 14 in impurity concentration and depth (thickness). On n+ type region 61 is formed polysilicon layer 21, on which an electrode 62 made of material, such as aluminum or aluminum-silicon, is formed. Note that this electrode 62 is left open.

The distance l3 between p+ type gate region 13, which is located at an extreme end on the side of the peripheral portion of n⁻ type epitaxial layer 12' and hereinafter referred to as extreme p+ type gate region 13' for convenience, and n+ type region 61 is about 15 micrometers. The distance l4 from the undersides of extreme P+ type gate region 13' and p+ type gate region 13 to the interface between n+ type substrate 11 and n⁻ type epitaxial layer 12' is about 20 micrometers. Because of l3<l4, with a reverse bias voltage higher than the gate-drain withstand voltage applied between gate electrode 16 and drain electrode 18, therefore, the breakdown voltage VRG between extreme p+ type gate electrode 13' and n+ type region 61 is lower than the breakdown voltage $BV_{DG}$ between gate regions 13', 13 and n+ type substrate 11 ($BV_{RG}<BV_{DG}$). As is well known, there is an interface state at the interface between n⁻ type epitaxial layer 12' and oxide layer 15'. Also, there are fixed charges, mobile ionic charges and trapped charges in oxide layer 15'. For this reason, the interface between n⁻ type epitaxial layer 12' and oxide layer 15' is electrically unstable and its insulating property is also unstable. It is therefore desired that the distances l3 and l2 be determined taking the insulating property of the interface between n⁻ type epitaxial layer 12' and oxide layer 15' consideration.

Figure 2B:
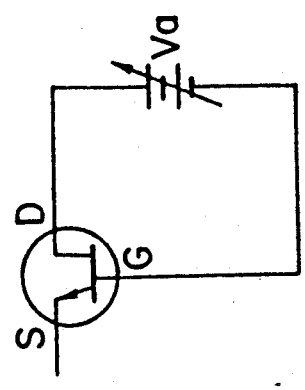
FIGS. 2A and 2B illustrate methods of measuring the drain-source breakdown voltage and the drain-gate breakdown voltage.
Figure 2A:
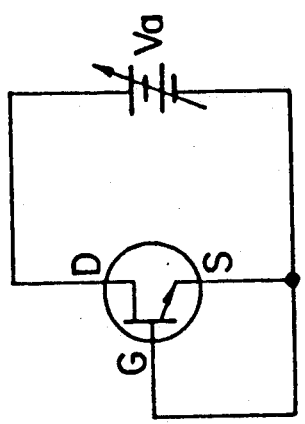
Figure 3:
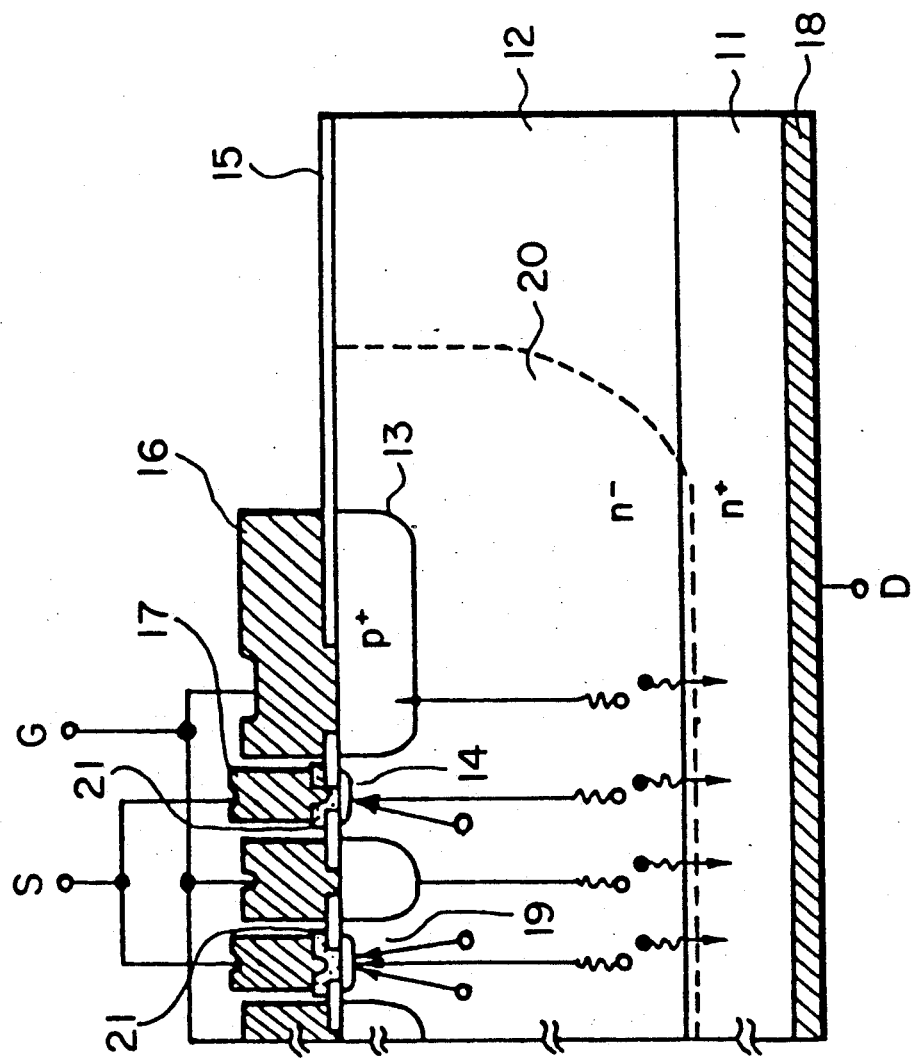
FIG. 3 is a diagram illustrating the widening of a depletion region when a reverse bias voltage is applied between the gate and drain of the static induction transistor of FIG. 1.
Figure 8:
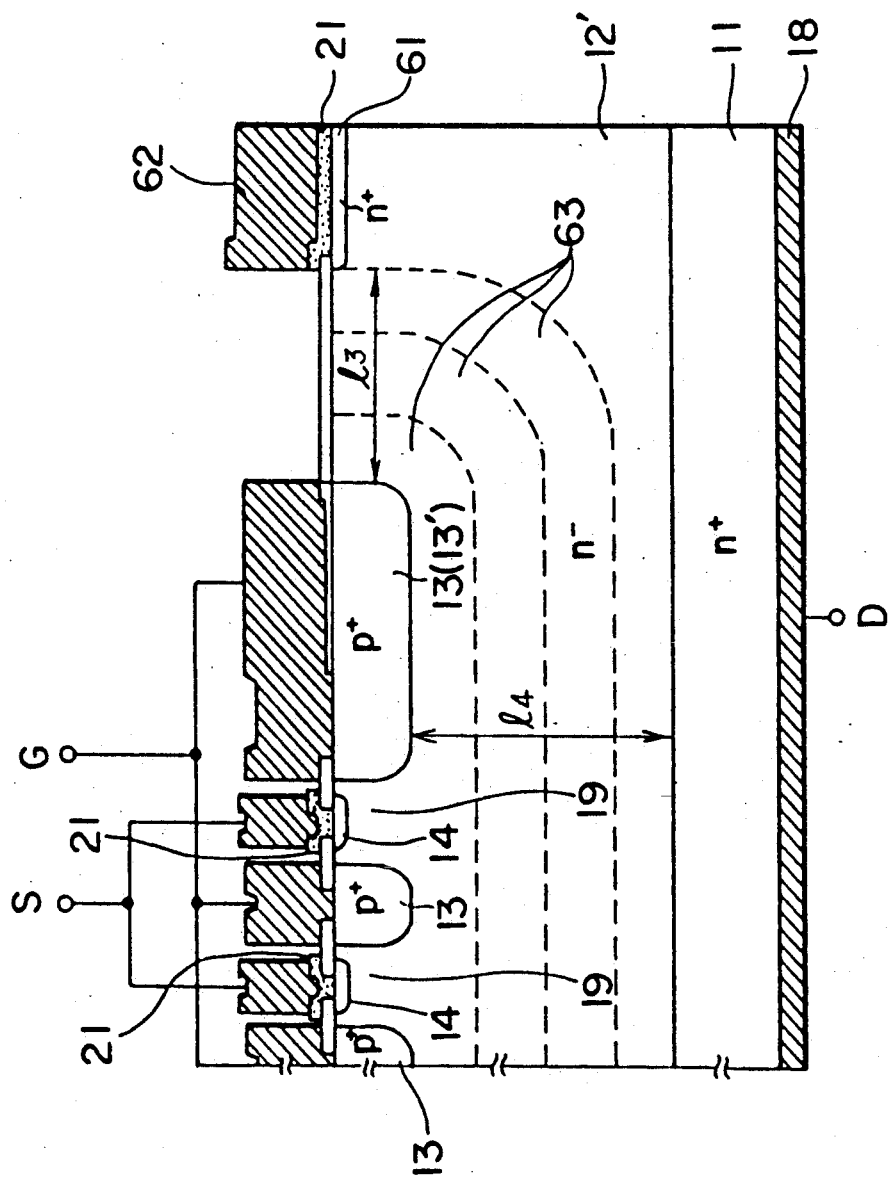
FIG. 8 is a diagram illustrating the widening of a depletion region when a reverse bias voltage is applied between the gate and drain of the static induction transistor of FIG. 8.

With a voltage Va applied between gate electrode 16 and drain electrode 18 to reverse bias the gate-to-drain path defined by p+ type gate region 13 or extreme p+ type gate region 13' and n− type epitaxial layer 12' and n+ type substrate 11 as shown in FIG. 2A, depletion region 63 will widen out as the reverse bias voltage Va increases as illustrated in broken lines in FIG. 8. When the reverse voltage goes to a predetermined voltage, depletion layer 63 reaches the interface between n− epitaxial layer 12' and n+ type region 61 before it reaches the interface between n+ type substrate 11 and n− type epitaxial layer 12'. When the reverse bias voltage Va is further increased so that the critical electric field $E_{crit}$ at which the avalanche breakdown begins is reached by the electric field across the junction defined by extreme p+ type gate region 13' and n− type epitaxial layer 12', the primary avalanche breakdown will occur at the junction.

Hot carriers resulting from the primary avalanche breakdown mainly flow between extreme p+ type gate region 13' and n+ type region 61. Therefore, no secondary avalanche breakdown will be caused at the interface between n− type epitaxial layer 12' and n+ type substrate 11 which contains many crystal defects by the mechanism described in the Description of the Related Art.

For this reason, even if a reverse bias voltage higher than the gate-drain withstand voltage is applied between the gate and drain, no avalanche breakdown will occur in depletion region 63 immediately below n+ type source region 14. Unlike the prior art, therefore, holes (hot holes) will not be injected into channel region 19 and n+ type source region 14.

Because the avalanche breakdown is caused to occur in depletion region 63 between extreme p+ type gate region 13' and n+ type region 61 before it occurs in depletion region 63 immediately below n+ type source region 14 in that way, even if a reverse voltage higher than the gate-drain withstand voltage is applied, the holes (hot holes) will not be injected into channel region 19 and n+ type source region 14, thus preventing the deterioration of the voltage-withstanding property and destruction of the device.

Next, a method of manufacturing the n-channel SIT of the above structure will be described with reference to FIGS. 9A to 9G.

These figures are sectional views of a unitary part of an n channel SIT. The dimensions of its various parts are exaggerated for easier understanding of manufacturing steps and they are thus not in proportion to those in a real device.

Figure 9:
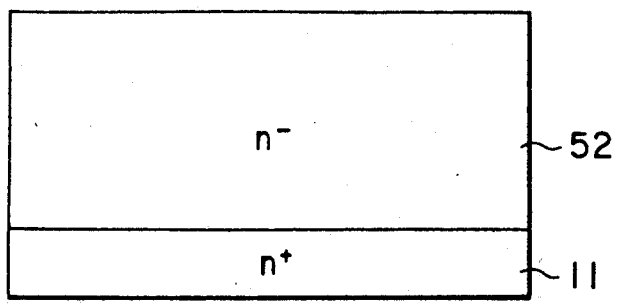
FIGS. 9A to 9G illustrate successive steps of manufacture of the static induction transistor of FIG. 8.
Figure 9:
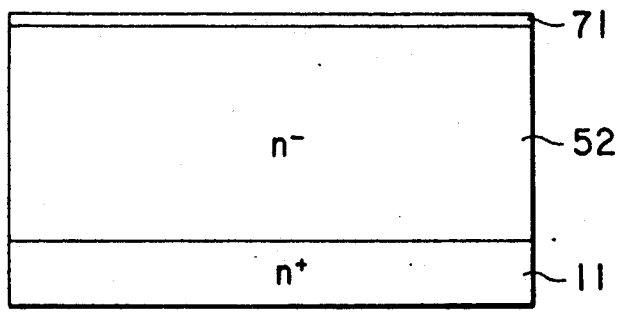
Figure 9:
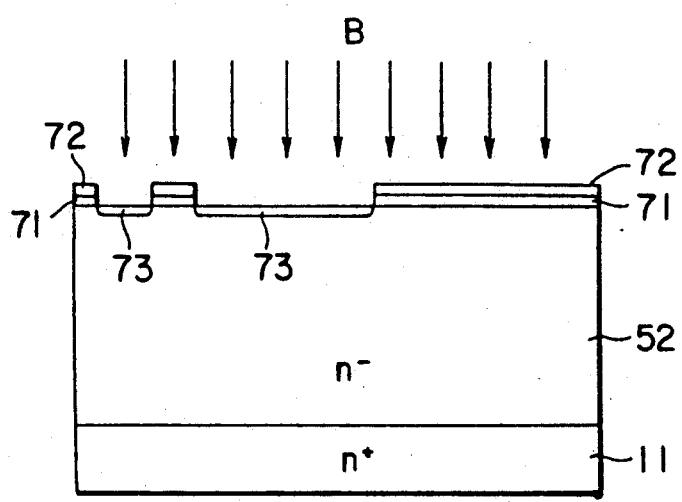
Figure 9:
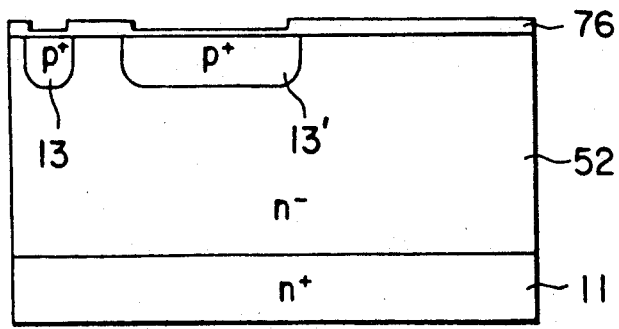

First, as shown in FIG. 9A, an n− type layer 52 is epitaxially grown over one of major surfaces of an n+ type silicon substrate 11 which is heavily doped with donors, for example, antimony (Sb) to a thickness of about 25 micrometers.

Subsequently, as shown in FIG. 9B, a first oxide layer 71, such as silicon dioxide, is formed on the entire surface of n− type epitaxial layer 52 to a thickness of about 700 Å. Then, as shown in FIG. 6C, portions of first oxide layer 71 which are located over regions where p+ type gate region 13 and extreme p+ are etched away by a conventional photolithographic process. Next, by using oxide layer 71 and photoresist layer 72 as a mask, acceptors, such as boron (B), are introduced into n− type epitaxial layer 52 through the openings formed in layers 44 and 45 to form p+ type regions 73 in the vicinity of the major surface of epitaxial layer 52. These p+ type regions 73 have an impurity concentration of about $10^{19}$ impurities per cubic centimeter.

Subsequently, as shown in FIG. 9D, drive-in diffusion is performed to drive p+ type regions 73 deeper into n− type epitaxial layer 52, thereby forming p+ type gate region 13 and extreme p+ type gate region 13'. Following the drive-in diffusion, a second oxide layer 76 consisting of silicon dioxide is formed on the surface of n− type epitaxial layer 52 as shown.

Figure 9E:
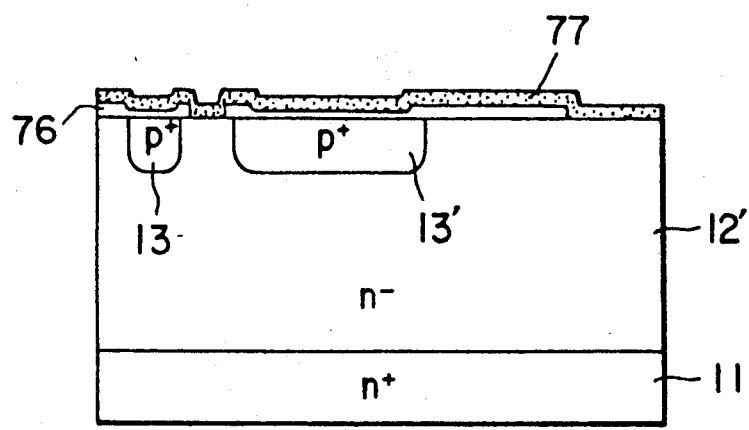
Figure 9F:
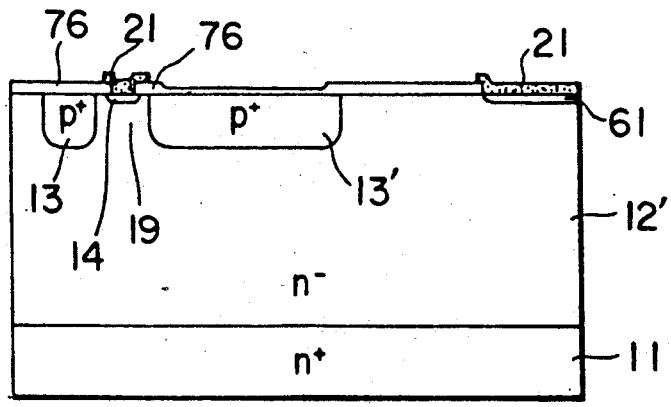

Furthermore, as shown in FIG. 9E, after portions of second oxide layer 76 which are located over the regions where n+ type source region 14 and n+ type region 61 are to be formed are etched away by means of a photolithographic process, a polysilicon layer 77 is formed over the surface of n− type epitaxial layer 52, on which second oxide layer 76 is formed, by means of silane thermal decomposition using regular CVD or low pressure CVD. Subsequently, as shown in FIG. 9F, donor ions of, for example, phosphorus (P) are implanted into the upper surface of n− type epitaxial layer 52 on which second oxide layer 76 and polysilicon layer 77 are formed to form n+ type source region 14 and n+ type region 61 in the vicinity of the surface of n− type epitaxial layer 52 by means of solid-phase diffusion. These n+ type source region 14 and n+ type region 61 have a depth of about 0.4 micrometers and an impurity concentration of about $1 \times 10^{20}$ impurities per cubic centimeter. Next, by using a photolithographic process, polysilicon layer 77 is selectively etched away to leave polysilicon layer 21 at portions, one of which being located over n+ type source region 14 and overlapping second oxide layer 76 on the both sides of source region 14 and the other of which being located over n+ type region 61 and overlapping second oxide layer 76 adjacent to one end of region 61.

Figure 9G:
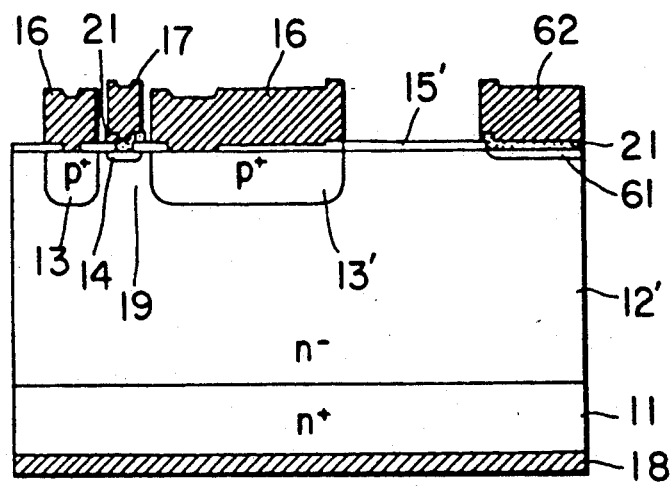

Furthermore, as shown in FIG. 9G, by using a photolithographic process, second oxide layer 76 is selectively etched away to form contact holes on p+ type gate region 13 and extreme p+ type gate region 13". Next, by means of sputtering or vacuum evaporation, an electrode material, such as aluminum or aluminum-silicon, is deposited onto the entire surface of n− type epitaxial layer 12' on which oxide layer 76 (15') and polysilicon layer 21 are formed. Then, the electrode material is selectively removed by means of a photolithographic process to thereby form source electrode 17, gate electrodes 16 and electrode 62. Furthermore, an electrode material, such as aluminum or aluminum-silicon, is deposited onto the other major surface of n+ type substrate 11 by means of sputtering or vacuum evaporation to thereby form drain electrode 18.

The above embodiments represent examples of applications of the present invention to a surface gate type of n-channel SIT. Of course, the present invention may be applied to a surface gate type of p-channel SIT in which the conductivity type of each region is reversed. In addition, the present invention may be applied to a buried gate type of n-channel or p-channel SIT. The present invention may be applied to germanium (Ge) devices and compound semiconductor devices such as gallium arsenide (GaAs) devices as well as silicon (Si) devices.

Furthermore, it should be noted that the specific numeric values on dimensions and impurity concentrations which were described in connection with the embodiments are only illustrative and not restrictive.

According to the present invention, as described above, the avalanche breakdown, which occurs at the interface between a semiconductor layer of a first conductivity type and a drain region of the first conductivity type when a reverse voltage higher than the gate-drain withstand voltage is applied between the gate and drain, is allowed to occur only in a region immediately below a protrusion of a gate region (a peripheral gate region) of a second conductivity type which is formed in a peripheral portion in the vicinity of a major surface of the semiconductor layer of the first conductivity type, immediately below a protrusion of a buried gate region (a peripheral buried gate region) of the second conductivity type which is buried in a peripheral portion of the semiconductor layer of the first conductivity type, or between a semiconductor region of the first conductivity type which is formed in the semiconductor layer of the first conductivity type on the side of a peripheral portion thereof and a gate region of the second conductivity type which is nearest to the semiconductor region. Thus, hot carriers resulting from the avalanche breakdown which occurs at the interface will not flow into a source region, permitting prevention of the deterioration of the voltage-withstanding property and destruction of the device.

What is claimed is:

1. A static induction transistor comprising a semiconductor layer of a first conductivity type, spaced apart gate regions of a second conductivity type disposed adjacent a first major surface of said semiconductor layer, a source region of said first conductivity type formed adjacent said first major surface of said semiconductor layer in between each of said gate regions, said source regions being shallower than said gate regions, and a drain region of said first conductivity type formed on a second major surface of said semiconductor layer generally opposite said first major surface, wherein one of said gate regions is located nearer to the periphery of said semiconductor layer than the other of said gate regions and has a portion formed deeper than the remainder of said one gate region so as to protrude toward said drain region, said deeper portion of said one gate region being located at a predetermined distance from that boundary of said one gate region that is closest to a source region, said predetermined distance being greater than the distance between said protruding deeper gate portion and said drain region and spaced sufficiently close to said drain region to restrict avalanche breakdown to the area immediately below said deeper portion and prevent holes from flowing into the channel regions below said source regions.

2. A static induction transistor according to claim 1, in which said one gate region is larger horizontally than the other of said gate regions.

3. A static induction transistor according to claim 2, in which said protruding deeper gate portion is formed in said gate region adjacent that boundary of said one gate region that is closest to said periphery of said semiconductor layer.

4. A static induction transistor comprising a semiconductor layer of a first conductivity type, spaced apart buried gate regions of a second conductivity type formed within said semiconductor layer, a source region of said first conductivity type formed adjacent a first major surface of said semiconductor layer, said source region having a higher impurity concentration than said semiconductor layer, and a drain region of said first conductivity type formed on a second major surface of said semiconductor layer generally opposite said first major surface, wherein one of said buried gate regions is located nearer to the periphery of said semiconductor layer than the other of said gate regions and has a portion formed deeper than the remainder of said one gate region so as to protrude toward said drain region, said deeper portion of said one gate region being located at a predetermined distance from that boundary of said one gate region that is closest to a source region, said predetermined distance being greater than the distance between said protruding deeper gate portion and said drain region and spaced sufficiently close to said drain region to restrict avalanche breakdown to the area immediately below said deeper portion and prevent holes from flowing into the channel regions below said source regions.

5. A static induction transistor according to claim 4, in which said one buried gate region is larger horizontally than the other of said buried gate regions.

6. A static induction transistor according to claim 5, in which said protruding deeper gate portion is formed in said buried gate region adjacent that boundary of said one gate region that is closest to said periphery of said semiconductor layer.

7. A static induction transistor comprising a semiconductor layer of a first conductivity type, spaced apart gate regions of a second conductivity type disposed adjacent a first major surface of said semiconductor layer, a source region of said first conductivity type formed adjacent said first major surface of said semiconductor layer in between each of said gate regions, said source regions being shallower than said gate regions, and a drain region of said first conductivity type formed on a second major surface of said semiconductor layer generally opposite said first major surface, characterized in that a semiconductor region of said first conductivity type is formed in a peripheral portion of said semiconductor layer adjacent said first major surface at a distance from the nearest gate region that is less than the distance between said gate region and said drain region, whereby the withstand voltage between said semiconductor region and said nearest gate region is less than the withstand voltage between said gate regions and said drain region.

* * * * *